United States Patent
Zhang et al.

(10) Patent No.: US 7,763,510 B1
(45) Date of Patent: Jul. 27, 2010

(54) METHOD FOR PFET ENHANCEMENT

(75) Inventors: Da Zhang, Hopewell Junction, NY (US); Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/349,974

(22) Filed: Jan. 7, 2009

(51) Int. Cl.
H01L 21/8238 (2006.01)
H01L 29/80 (2006.01)

(52) U.S. Cl. ............ 438/199; 438/222; 438/226; 438/289; 438/303; 257/274; 257/310; 257/E21.611; 257/E21.618; 257/E21.626

(58) Field of Classification Search ............ 438/199, 438/222, 226, 289, 303, 791, 792; 257/69, 257/229, 274, 310, E21.611, E21.618, E21.626
See application file for complete search history.

(56) References Cited

U.S. PATENT DOCUMENTS

| | | | |
|---|---|---|---|
| 6,624,466 B2 | 9/2003 | Chen | |
| 7,327,001 B1 * | 2/2008 | Singhal et al. | 257/377 |
| 2003/0139025 A1 * | 7/2003 | Lee et al. | 438/528 |
| 2005/0233514 A1 * | 10/2005 | Bu et al. | 438/199 |
| 2007/0161258 A1 * | 7/2007 | Nam et al. | 438/783 |
| 2008/0149928 A1 * | 6/2008 | Moriguchi et al. | 257/49 |
| 2008/0242017 A1 * | 10/2008 | Lee et al. | 438/231 |
| 2008/0258175 A1 * | 10/2008 | Peidous et al. | 257/190 |

* cited by examiner

*Primary Examiner*—Hsien-ming Lee
(74) *Attorney, Agent, or Firm*—Hamilton & Terrile, LLP; Michael Rocco Cannatti

(57) ABSTRACT

A semiconductor process and apparatus includes forming PMOS transistors (90) with enhanced hole mobility in the channel region by forming a hydrogen-rich silicon nitride layer (91, 136) on or adjacent to sidewalls of the PMOS gate structure as either a hydrogen-rich implant sidewall spacer (91) or as a post-silicide hydrogen-rich implant sidewall spacer (136), where the hydrogen-rich dielectric layer acts as a hydrogen source for passivating channel surface defectivity under the PMOS gate structure.

18 Claims, 4 Drawing Sheets

METHOD FOR PFET ENHANCEMENT

BACKGROUND OF THE INVENTION

1. Field of the Invention

The present invention is directed in general to the field of semiconductor fabrication and integrated circuits. In one aspect, the present invention relates to forming PMOS field effect transistors (FETs) as part of a complementary metal oxide semiconductor (CMOS) fabrication process.

2. Description of the Related Art

CMOS devices, such as NMOS or PMOS transistors, have conventionally been fabricated on semiconductor wafers with a surface crystallographic orientation of (100), and its equivalent orientations, e.g., (010), (001), (00-1), where the transistor devices are typically fabricated with a <100> crystal channel orientation (i.e., on 45 degree rotated wafer or substrate). The channel defines the dominant direction of electric current flow through the device, and the mobility of the carriers generating the current determines the performance of the devices. While it is possible to improve carrier mobility by intentionally stressing the channels of NMOS and/or PMOS transistors, it is difficult to simultaneously improve the carrier mobility for both types of devices formed on a uniformly-strained substrate because PMOS carrier mobility and NMOS carrier mobility are optimized under different types of stress. For example, some CMOS device fabrication processes have attempted to enhance electron and hole mobilities by using strained (e.g. with a bi-axial tensile strain) silicon for the channel region that is formed by depositing a layer of silicon on a template layer (e.g., silicon germanium) which is relaxed prior to depositing the silicon layer, thereby inducing tensile stress in the deposited layer of silicon. Such processes enhance the electron mobility for NMOS devices by creating tensile stress in NMOS transistor channels, but PMOS devices are insensitive to any uniaxial stress in the channel direction for devices fabricated along the <100> direction. On the other hand, attempts have been made to selectively improve hole mobility in PMOS devices, such as by forming PMOS channel regions with a compressively stressed SiGe layer over a silicon substrate. However, such compressive SiGe channel PMOS devices exhibit a higher sub-threshold slope (SS) and higher voltage threshold temperature sensitivity. This is in large part due to a degraded quality of the interface between the compressive SiGe layer and the dielectric layer which is quantified by the channel defectivity or interface trap density (Dit) in the PMOS devices.

Accordingly, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
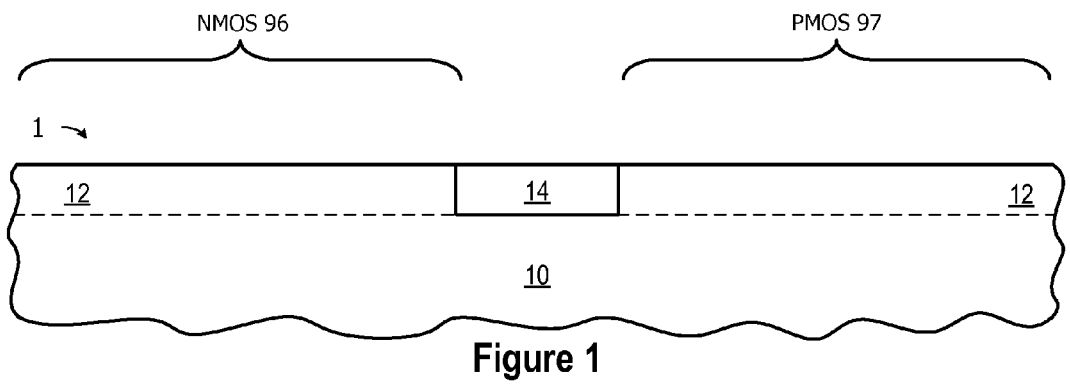
FIG. 1 is a partial cross-sectional view of a semiconductor wafer structure including a semiconductor layer having a first crystalline structure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A semiconductor fabrication process and resulting integrated circuit are described for manufacturing high performance PMOS transistor devices on a semiconductor wafer substrate which is used to form both PMOS and NMOS devices. By forming sidewall spacers with hydrogen-containing silicon nitride layer that is selectively implanted with hydrogen in the PMOS region, the channel stress and surface passivation conditions of the NMOS and PMOS devices in a semiconductor wafer are selectively controlled to produce an integrated circuit that is favorable for both NMOS and PMOS devices with reduced interface trap density in the PMOS devices. In selected embodiments, implant sidewall spacers are formed after implanting the source/drain extension regions around the metal gate electrodes by depositing a hydrogen-containing silicon nitride layer, selectively implanting hydrogen into the silicon nitride layer in the PMOS device region, and then anisotropically etching the silicon nitride layer to form implant sidewall spacers for the NMOS and PMOS transistor devices. The silicon nitride sidewall implant spacers are used as an implant mask during implantation of the deep source/drain regions. The hydrogen implantation into the silicon nitride spacer in the PMOS region provides a source of hydrogen that improves the interface trap density (DIT) to reduce channel defectivity in the PMOS devices. In other embodiments, additional sidewall spacers are formed after the NMOS and PMOS (silicided) deep source/drain regions are formed by first removing the implant sidewall spacers from the NMOS and PMOS metal gate electrodes, and then depositing a hydrogen-rich silicon nitride layer over the NMOS and PMOS metal gate electrodes which may also be selectively implanted with additional hydrogen in the PMOS device region. The hydrogen-rich silicon nitride layer provides a source of hydrogen that improves the interface trap density (DIT) to reduce channel defectivity in the PMOS devices. By forming hydrogen-rich sidewall spacers in close proximity to the PMOS channel region, hydrogen-assisted interface trap passivation is enabled by introducing hydrogen which passivates surface dangling bonds of the channel semiconductor.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Referring now to FIG. 1, there is shown a partial cross-sectional view of a semiconductor wafer structure 1. The structure 1 includes a semiconductor layer 12 formed on or as part of a semiconductor substrate 10 that has a first crystallographic orientation. Also illustrated is a shallow trench isolation 14 that divides the layer 12 into separate regions. Depending on the type of transistor device being fabricated, the semiconductor layer 10, 12 may be implemented as a bulk silicon substrate, single crystalline silicon (doped or undoped), semiconductor on insulator (SOI) substrate, or any semiconductor material including, for example, Si, SiC, SiGe, SiGeC, Ge, GaAs, InAs, InP, as well as other III/V or II/VI compound semiconductors or any combination thereof, and may optionally be formed as the bulk handling wafer. The semiconductor layer 10, 12 has a channel crystallographic orientation of <100>. Although not shown, the materials of layer 12 for NMOS and PMOS device areas 96, 97 may be different. And for any FET type (NMOS or PMOS), the layer 12 may consist of multiple stacks of materials. Of note is that although bulk type of substrate is shown here for the description of the invention, the invention is not limited to any specific substrate type. For example, the starting substrate for the invention can be of semiconductor-on-insulator (SOI) type having a buried insulator layer under a top layer of semiconductor.

The isolation regions or structures 14 are formed to electrically isolate the NMOS device area(s) 96 from the PMOS device area(s) 97. Isolation structures 14 define lateral boundaries of an active region or transistor region 96, 97 in active layer 12, and may be formed using any desired technique, such as selectively etching an opening in the second semiconductor layer 12 using a patterned mask or photoresist layer (not shown), depositing a dielectric layer (e.g., oxide) to fill the opening, and then polishing the deposited dielectric layer until planarized with the remaining second semiconductor layer 12. Any remaining unetched portions of the patterned mask or photoresist layer(s) are stripped or removed.

Figure 2:
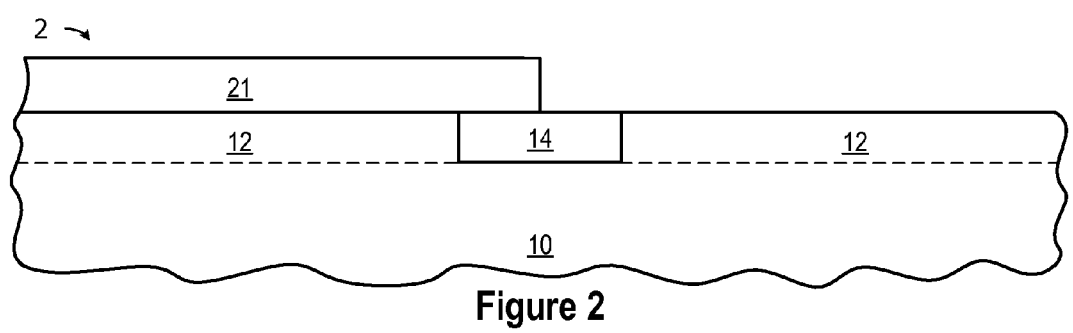
FIG. 2 illustrates processing subsequent to FIG. 1 where a masking layer is formed over NMOS areas of the semiconductor wafer structure that will be used to form NMOS devices.

FIG. 2 illustrates processing of a semiconductor wafer structure 2 subsequent to FIG. 1 where a masking layer 21 is selectively formed over NMOS areas 96 of the semiconductor wafer structure that will be used to form NMOS devices. For example, one or more masking layers 21 (e.g., an oxide layer and/or nitride layer) may be deposited and/or grown over the semiconductor wafer structure, and then conventional patterning and etching techniques may be used to form an opening in the mask layer(s) 21 that exposes at least the PMOS device area 97. The selectively formed masking layer 21 is used to define and differentiate active regions for NMOS and PMOS devices subsequently formed on the wafer structure 12.

Figure 3:
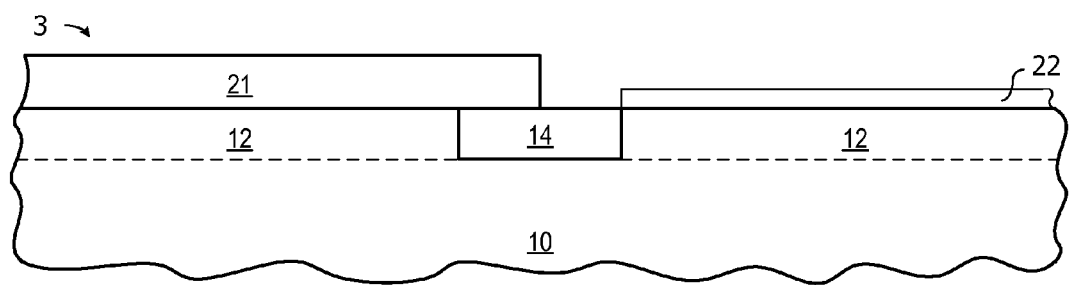
FIG. 3 illustrates processing subsequent to FIG. 2 after an epitaxial SiGe layer is selectively formed over PMOS areas of the semiconductor wafer structure that will be used to form PMOS devices.

FIG. 3 illustrates processing of a semiconductor wafer structure 3 subsequent to FIG. 2 after a thin, compressively stressed semiconductor layer 22 is selectively formed over the PMOS area(s) 97 of the semiconductor wafer structure that will be used to form PMOS devices. In selected embodiments, the thin, compressively stressed semiconductor layer 22 is formed with a semiconductor material having larger atom-to-atom spacing than the underlying second semiconductor layer 12, such as SiGe, SiGeC, or combinations and composition by weight thereof, which is capable of being formed utilizing a selective epitaxial growth method or other deposition methods accompanied by subsequent re-crystallization. For example, if PMOS devices are formed over the semiconductor layer 12 in the PMOS area 97 and the semiconductor material for layer 12 is silicon, the semiconductor layer 22 may be formed by epitaxially growing a SiGe layer that is thicker than a critical relaxation thickness to form a compressive SiGe layer 22. This epitaxial growth may be achieved by a process of chemical vapor deposition (CVD) at a chamber temperature between 400 and 900° C. in the presence of dichlorosilane, germane (GeH$_4$), HCl, and hydrogen gas. So long as the thickness of the SiGe layer 22 is larger than the critical relaxation thickness, the SiGe layer 22 is compressively stressed. As will be appreciated, the critical relaxation thickness for a SiGe layer will depend on the amount of germanium contained in the layer 22, though in an example embodiment, an epitaxially grown SiGe layer 22 that is approximately 50 Angstroms or more will have a biaxial compressive strain because of the lattice mismatch between layers 22 and 12. Another advantage of forming a relatively thin semiconductor layer 22 is to minimize the step height difference between the finally formed NMOS and PMOS device areas 96, 97, thereby improving processing uniformity between the two areas. While not shown, the silicon germanium layer 22 may be provided with a grading or concentration of germanium as a function of depth, and there may also be a silicon cap layer formed or epitaxially grown over the silicon germanium layer 22 in the PMOS area(s) 97 of the semiconductor wafer structure. As described herein, the compressively stressed SiGe layer 22 is highly susceptible to interface degradation which can be reduced by providing the hydrogen passivation benefits described herein, but it will be appreciated that a compressively stressed SiGe layer 22 is not required since the hydrogen passivation benefits may also be obtained with reference to silicon channel devices.

Figure 4:
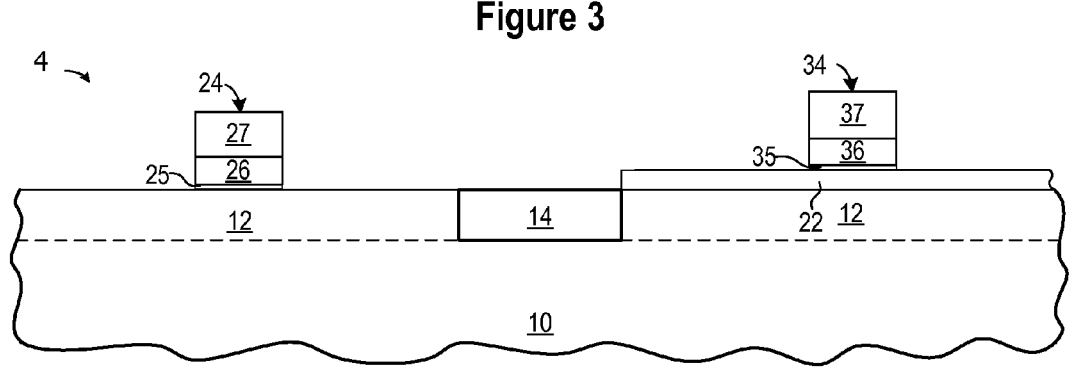
FIG. 4 illustrates processing subsequent to FIG. 3 after metal gate electrodes are formed in the NMOS and PMOS areas.

FIG. 4 illustrates processing of a semiconductor wafer structure 4 subsequent to FIG. 3 after the mask layer 21 is removed, and metal gate electrodes 24, 34 are formed in the NMOS and PMOS areas 96, 97, respectively. As illustrated, NMOS metal gate electrode 24 includes one or more gate dielectric layers 25, a metal-based conductive layer 26 overlying the gate dielectric 25, and a polysilicon layer 27 formed on the metal-based layer 26. In similar fashion, PMOS metal gate electrode 34 includes one or more gate dielectric layers 35, a metal-based conductive layer 36 overlying the gate dielectric 35, and a polysilicon layer 37 formed on the metal-based layer 36. Gate dielectric layer(s) 25, 35 may be formed by depositing or growing an insulator or high-k dielectric over the NMOS substrate layer 12 and/or PMOS substrate layer 22 using chemical vapor deposition (CVD), plasma-enhanced chemical vapor deposition (PECVD), physical vapor deposition (PVD), atomic layer deposition (ALD), thermal oxidation, or any combination(s) of the above to a predetermined final thickness in the range of 0.1-10 nanometers, though other thicknesses may be used. While the gate dielectric layer(s) 25, 35 may be formed with insulator materials (such as silicon dioxide, oxynitride, nitride, nitride $SiO_2$, $SiGeO_2$, $GeO_2$, etc.), other suitable materials include metal oxide compounds such as hafnium oxide (preferably $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiN_yO_x$, $ZrSiN_yO_x$, $ZrHfOx$, $LaSiO_x$, $YSiO_x$, $ScSiO_x$, $CeSiO_x$, $HfLaSiO_x$, $HfAlO_x$, $ZrAlO_x$, and $LaAlO_x$. In addition, multi-metallic oxides (for example barium strontium titanate, BST) may also provide high-k dielectric properties.

After forming the gate dielectric layer(s) 25, 35, an unetched gate stack is formed using any desired metal gate stack formation sequence. For example, one or more conductive layers are sequentially deposited or formed over the gate dielectric layer(s) 25, 35 to form a first gate stack that includes at least (doped or undoped) semiconductor layer 27, 37 formed over a metal-based conductive layers 26, 36. In one embodiment, the one or more metal or metal-based layers 26, 36 are formed using any desired deposition or sputtering process, such as CVD, PECVD, PVD, ALD, molecular beam deposition (MBD) or any combination(s) thereof. The metal-based conductive layers 26, 36 include an element selected from the group consisting of Ti, Ta, Ir, Mo, Ru, W, Os, Nb, Ti, V, Ni, and Re. In selected embodiments, the metal-based conductive layer 36 may be formed with a metal or metal-based layer that has a mid-gap work function that is suitable for NMOS and PMOS transistors, such as by depositing a TiN layer having a thickness of 20-100 Angstroms, though other metallic gate layer materials (such as Al, W, HfC, TaC, TaSi, ZrC, Hf, etc.) or even a conductive metal oxide (such as $IrO_2$), and different thicknesses, may be used. In addition or in the alternative, the metal-based conductive layer 26 may be formed with a metal or metal-based layer that has a work function that is suitable for a PMOS transistor. As will be appreciated, the metal-based conductive layers 26, 36 may be formed from one or more layers. While the present description is provided with reference to selected embodiments employing a metal gate and high-k gate dielectric structure, it will be appreciated that the hydrogen passivation benefits may also be obtained with reference to non-metal gates, such as PMOS polysilicon gates formed on a SiON gate dielectric layer.

After depositing the metal-based conductive layer(s) 26, 36, a heavily doped (e.g., n+) polysilicon layer 27, 37 may be formed using CVD, PECVD, PVD, ALD, or any combination(s) thereof to a thickness in the range of approximately 1-200 nanometers, though other materials and thicknesses may be used. As deposited, the polysilicon layer 27, 37 may be formed as an undoped or lightly doped layer having relatively low conductivity or current flow, in which case the conductivity in the polysilicon layer is established with one or more subsequent doping or implantation steps. However, it will be appreciated, that the polysilicon layer 27, 37 may be formed as a heavily doped layer having relatively high conductivity, in which case the conductivity in the polysilicon layer may be reduced in a predetermined region of the silicon-containing layer by counter-doping with one or more subsequent doping or implantation steps. As deposited, the polysilicon layer 27, 37 can be formed in an initial amorphous or polycrystalline state, but it will be in a polycrystalline state after subsequent annealing steps in the device integration. The material(s) for the polysilicon layer 27, 37 can be silicon, silicon-germanium, or other suitable semiconductors.

Once the unetched gate stack is formed, NMOS gate electrode layers 25-27 and PMOS gate electrode layers 35-37 are selectively etched to form the NMOS metal gate electrode(s) 24 and PMOS metal gate electrode(s) 34. As will be appreciated, the metal gate electrodes 24, 34 may be formed using any desired pattern and etching processes, including application and patterning of photoresist directly on the semiconductor layer 27, 37, or using a multi-layer masking technique to sequentially forming a first anti-reflective coating (ARC) layer, a second masking layer (such as a hardmask or TEOS layer) and a photoresist layer (not shown) which is patterned and trimmed to form a resist pattern over the intended gate electrodes 24, 34. The first ARC layer will act as a hard mask when the semiconductor layers 27, 37 and metal-based conductive layers 26, 36 are subsequently etched. In turn, the second masking layer will serve as a hard mask for the etching of the first ARC layer, and the photoresist layer may be formed from any appropriate photoresist material (e.g., 193 nm resist) that is patterned (e.g., using a 193 nm develop) and etched to form a resist pattern over the second masking layer.

Figure 5:
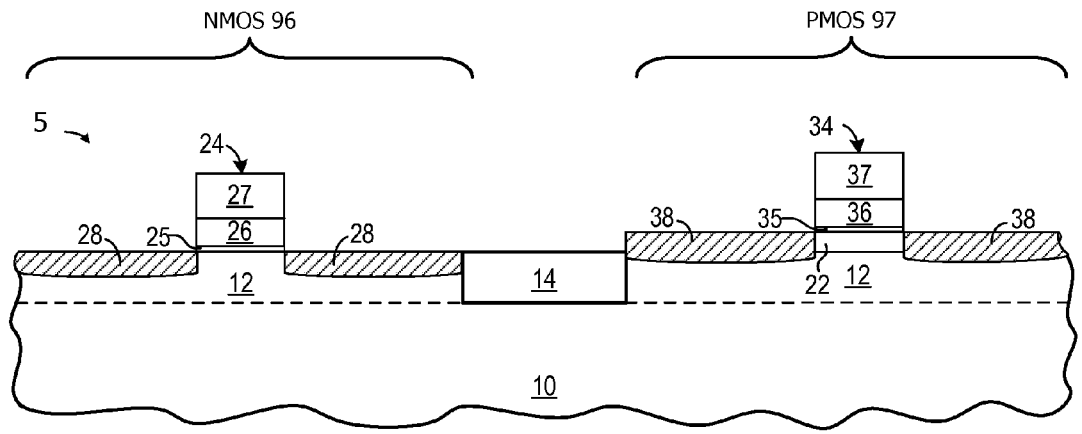
FIG. 5 illustrates processing subsequent to FIG. 4 after first extension source/drain regions are implanted in the NMOS and PMOS areas.

FIG. 5 illustrates processing of a semiconductor wafer structure 5 subsequent to FIG. 4 after first extension source/drain regions 28, 38 are implanted in the NMOS and PMOS areas 96, 97, respectively. Though not explicitly illustrated, the first extension source/drain regions 28, 38 may be formed by first masking the PMOS area 97 and implanting exposed portions of the NMOS area 96 (including the semiconductor layer 12) with a first n-type implant to form the lightly doped extension regions 28. Separately, the NMOS area 96 may be masked and exposed portions of the PMOS area 97 (including the semiconductor layer 12 and compressively stressed SiGe layer 22) may be implanted with p-type impurities to form the lightly doped extension regions 38 in the PMOS transistor areas 97. Though not shown, the implantation steps may be used to implant the gate electrodes 24, 34.

Figure 6:
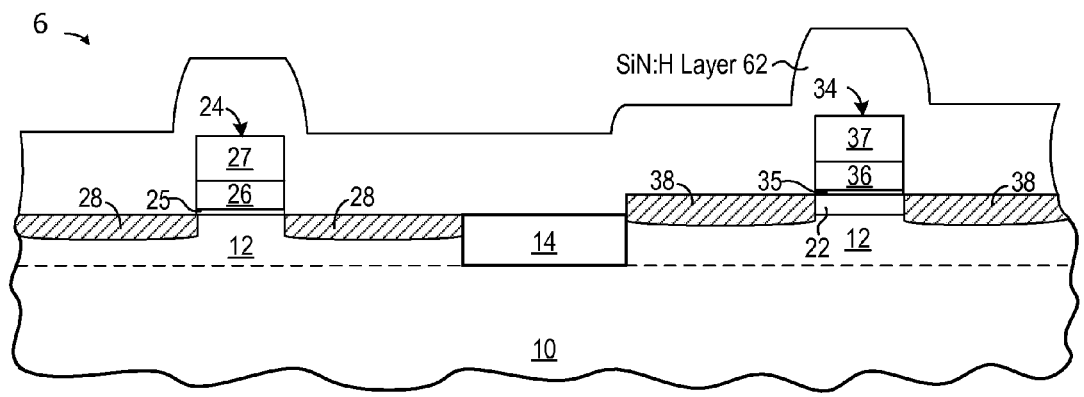
FIG. 6 illustrates processing subsequent to FIG. 5 after a hydrogen-containing silicon nitride layer is deposited over the metal gate electrodes.

Referring now to FIG. 6, there is illustrated the processing of the semiconductor wafer structure 6 subsequent to FIG. 5 after a hydrogen-containing dielectric layer 62 is deposited over the NMOS and PMOS transistors 24, 34 in accordance with one or more first example embodiments. In selected embodiments, the hydrogen-containing dielectric layer 62 is formed as silicon nitride that is deposited using a plasma-enhanced CVD technique to a thickness in the range of 200-1000 Angstroms, and more particularly approximately 350 Angstroms, though other materials and/or thicknesses may be used. For a silicon nitride layer, typically the Si—N to Si—H bonding influences whether there is stress and/or the stress type (tensile or compressive). In the embodiments depicted in FIG. 6, the deposition conditions (e.g., deposition rate, pressure, UV curing, and other factors known in the art) may be selected to control the presence or type of stress created in the hydrogen-containing dielectric layer 62 and in between the layer 62 and the underlying NMOS and PMOS channel regions. While the hydrogen-rich dielectric layer 62 is depicted as being formed on the exposed sidewalls of the NMOS and PMOS gate structures 24, 34, it will be appreciated that hydrogen-rich dielectric layer 62 can also be formed on a dielectric liner layer located on the sidewalls of the gate structures. For example, the hydrogen-rich dielectric layer 62 may be deposited on a thin oxide liner (approximately 30-150A), and still effectively provide the hydrogen passivation benefits described herein.

Figure 7:
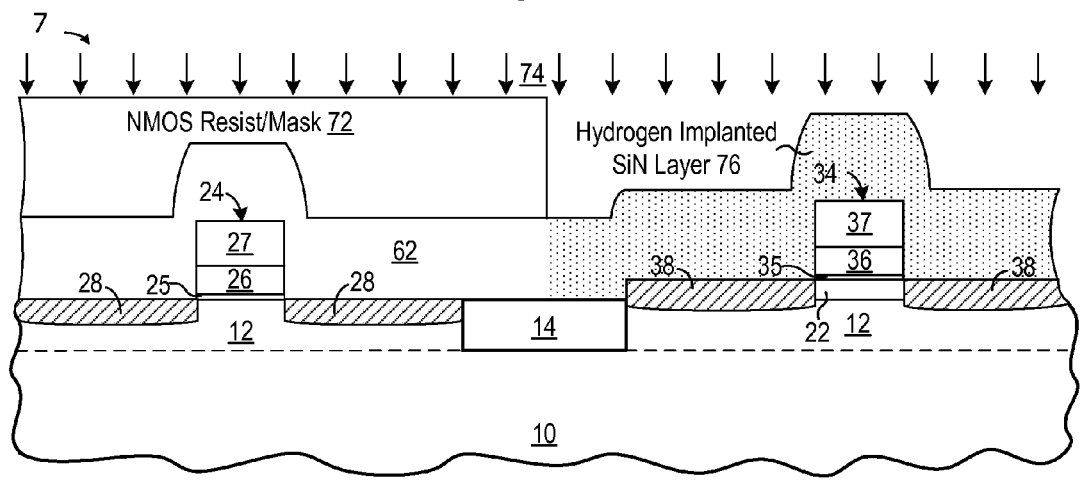
FIG. 7 illustrates processing subsequent to FIG. 6 after hydrogen is selectively implanted into the PMOS areas around a patterned implant mask.

FIG. 7 illustrates processing of the semiconductor wafer structure 7 subsequent to FIG. 6 after hydrogen 74 is selectively implanted into the hydrogen-containing dielectric layer 62 in the PMOS areas. A patterned implant mask 72 may be used to selectively implant the hydrogen 74 into the PMOS regions 97, such as by using a photoresist patterning process to form a photoresist-masking layer 72 over NMOS areas 96 of the semiconductor wafer structure 7 that will be used to form NMOS devices. For example, one or more photoresist or masking layers 72 (e.g., an oxide layer and/or nitride layer) may be deposited and/or grown over the semiconductor wafer structure, and then conventional patterning and etching techniques may be used to form an opening in the mask layer(s) 72 that exposes at least the PMOS device area 97. The selectively formed masking layer 72 is used to define and differentiate active regions for NMOS and PMOS devices subsequently formed on the semiconductor wafer structure 7.

After masking off the hydrogen-containing dielectric layer 62 in the NMOS region 96 with the patterned masking layer 72, the hydrogen-containing dielectric layer 62 is processed to increase the hydrogen content. While any desired hydrogen enhancement technique may be used, in selected embodiments, an implant 74 may be performed to implant hydrogen into the hydrogen-containing dielectric layer 62 in the PMOS region 97, thereby forming an implanted hydrogen-rich silicon nitride layer 76. In accordance with selected embodiments, the hydrogen implant 74 may be performed by implanting hydrogen atoms in an energy range of 2.5 KeV to 5.5 KeV at a dose of 1E15 to 1E16 per $cm^2$ or more, though other implant energies and/or doses may be used. By masking off the NMOS region 96 from the hydrogen implantation 74, the hydrogen-containing dielectric layer 62 is protected against additional hydrogen being formed in the NMOS region 96. After the hydrogen implantation step, the photoresist or mask layer 72 is stripped or removed. In selected embodiments, the final hydrogen atomic concentration in the hydrogen-implanted dielectric layer is greater than 7%.

Figure 8:
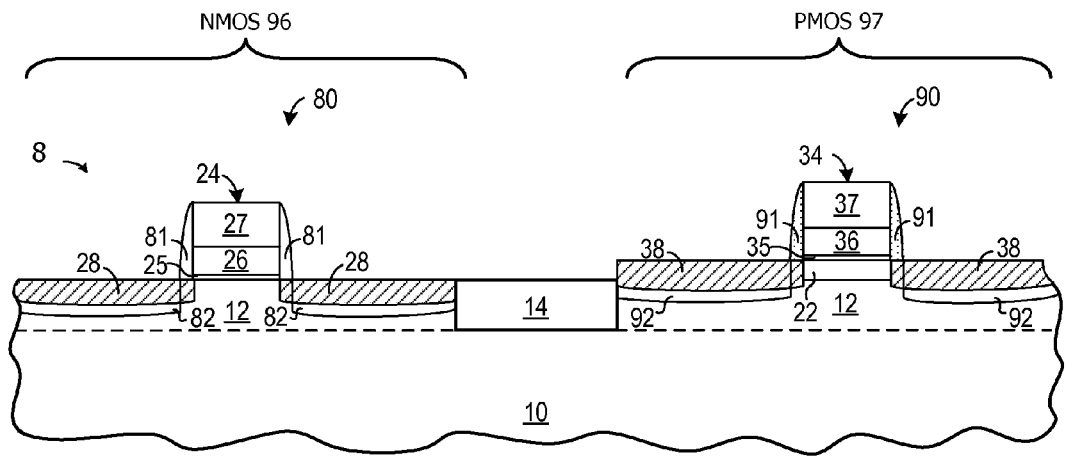
FIG. 8 illustrates processing subsequent to FIG. 7 after the silicon nitride layer is etched to form implant sidewall spacers on the metal gate electrodes and second source/drain regions are implanted in the NMOS and PMOS areas around the implant sidewall spacers.

FIG. 8 illustrates processing of the semiconductor wafer structure 8 subsequent to FIG. 7 after the hydrogen-containing dielectric layer 62 and implanted hydrogen-rich silicon nitride layer 76 are anisotropically etched to form implant sidewall spacers 81, 91 on the sidewalls of the NMOS and PMOS gates 26-27 and 36-37, respectively. As will be appreciated, any desired anisotropic or selectively directional etch technique may be used to form the implant sidewall spacers 81, 91, including a dry etching process such as reactive-ion etching, ion beam etching, plasma etching or laser etching or the like. The etch process is controlled to form implant sidewall spacers 81, 91 to have a controlled width having thickness in the range of 150-400 Angstroms, though other thicknesses may be used. As shown in FIG. 8, the implant sidewall spacers 81 formed on the NMOS gate electrodes are formed from the hydrogen-containing dielectric layer 62, and therefore a hydrogen-rich layer is not formed in close proximity to the NMOS channel region. In contrast, the implant sidewall spacers 91 formed on the PMOS gate electrodes are formed from the implanted hydrogen-rich silicon nitride layer 76. This effectively results in the additional implanted hydrogen being blocked from the NMOS channel region. By forming the hydrogen-rich spacers 91 in close proximity to the PMOS gate electrode sidewalls, improved hydrogen passivation is provided for the PMOS channel region.

FIG. 8 also shows that second heavily doped or deep source/drain regions 82, 92 are implanted in the NMOS and PMOS areas 96, 97, respectively, thereby forming NMOS transistors (80) and PMOS transistors (90). As illustrated, heavily doped source/drain regions 82 may be formed by selectively masking the PMOS area 97 to expose NMOS implant regions (not shown) and implanting n-type impurities into the exposed substrate layer 12, using the NMOS gate electrode(s) 26, 27 and the implant sidewall spacers 81 as an implant mask to protect the NMOS channel from implantation. In similar fashion, the extension region(s) 38 and/or heavily doped source/drain region(s) 92 in the PMOS area 97 may be formed by implanting p-type impurities into the exposed substrate layer 12 and SiGe layer 22 in the PMOS area 97 using the PMOS gate electrode(s) 36, 37 and the implant sidewall spacers 91 as an implant mask to protect the PMOS channel from implantation. Though not shown, it will be appreciated, that the NMOS and PMOS transistors 80, 90 may include silicide layers in the source/drain regions and gate electrodes.

Figure 9:
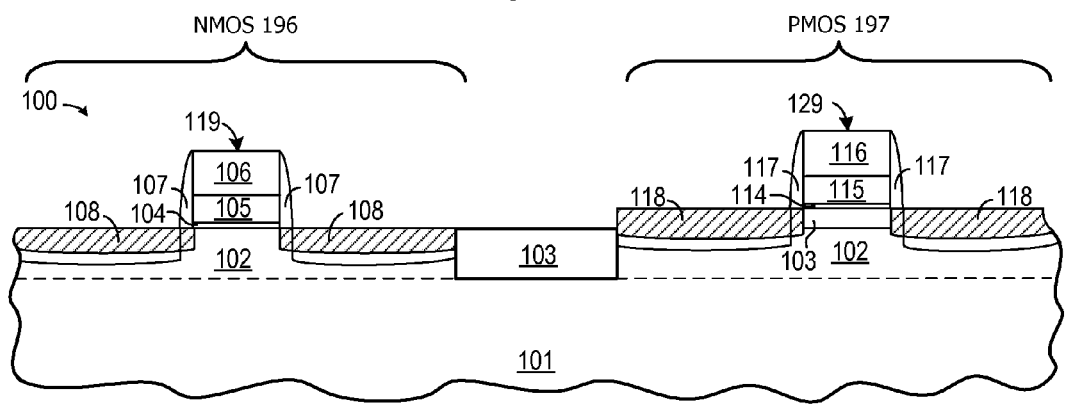
FIG. 9 is a partial cross-sectional view of a semiconductor wafer structure in which metal gate electrodes and source/drain regions have been formed in the NMOS and PMOS areas.

In addition to the forming implant sidewall spacers with a hydrogen-rich silicon nitride layer described hereinabove for the PMOS transistor devices, there are other techniques for differentially stressing the NMOS and PMOS channel regions. For example, FIG. 9 illustrates is a partial cross-sectional view of a semiconductor wafer structure 100 in accordance with other example embodiments in which metal gate electrodes 119, 129 and source/drain regions 108, 118 (including extension and deep source/drain regions) have been formed in the NMOS and PMOS areas 196, 197, respectively. As illustrated, NMOS gate electrode structure 119 may include one or more gate dielectric layers 104 formed over the NMOS active area 102 in the NMOS region 196, a conductive metal-based gate electrode layer 105 overlying the gate dielectric 104, a polysilicon gate electrode layer 106 overlying the metal-based gate electrode layer 105, and sidewall spacers 107 formed from one or more dielectric layers on the sidewalls of gate electrode layer 105, 106. In similar fashion, PMOS gate electrode structure 129 may include one or more gate dielectric layers 114 formed over the PMOS active layer 102 and SiGe active layer 103 in the PMOS region 197, a conductive metal-based gate electrode layer 115 overlying the gate dielectric 114, a polysilicon gate electrode layer 116 overlying the metal-based gate electrode layer 115, and sidewall spacers 117 formed from one or more dielectric layers on the sidewalls of gate electrode 115, 116. As implied by the sequence of the reference numerals, one or more sidewall spacers 107, 117 are formed on at least the sidewalls of the gate electrodes 105/106, 115/116 by depositing and anisotropically etching one or more spacer dielectric layers which may include an offset or spacer liner layer (e.g., a deposited or grown silicon oxide), alone or in combination with an extension dielectric layer. With the sidewall spacers 107, 117 in place, an implant mask (not shown) may be formed over the PMOS area 197 to expose the NMOS transistor area 196 to an implantation which forms the NMOS source/drain regions 108. Likewise, an implant mask (not shown) may be formed over the NMOS area 196 to expose the PMOS transistor area 197 to an implantation which forms the PMOS source/drain regions 118 around the PMOS gate electrode 129 and sidewall spacers 117. Though not shown, it will be appreciated, that the NMOS and PMOS transistors may include silicide layers in the source/drain regions and gate electrodes. As described herein, any desired fabrication techniques may be used to grow, deposit, pattern, remove, etch or otherwise forming the various transistor device features.

Figure 10:
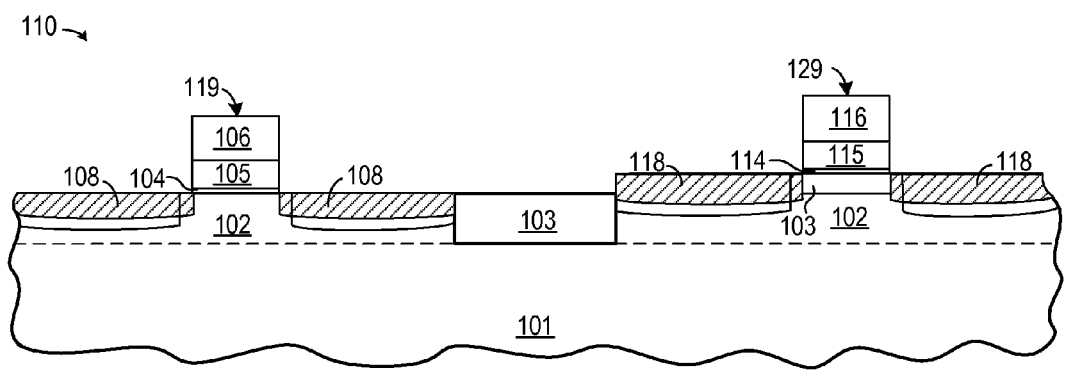
FIG. 10 illustrates processing subsequent to FIG. 9 after implant sidewall spacers have been removed from the metal gate electrodes.

FIG. 10 illustrates processing of the semiconductor wafer structure 110 subsequent to FIG. 9 after the implant sidewall spacers 107, 117 have been removed from the metal gate electrodes 119, 129, thereby exposing the gate sidewalls. As will be appreciated, any desired selective etch technique may be used to remove the implant spacers 107, 117. For example, if the sidewall implant spacers 107, 117 are formed with silicon nitride, an oxide liner layer (not shown) may be grown over the semiconductor wafer structure 110 to protect the exposed substrate layer 102 and gate layer 106, 116, and then a etch chemistry or process may be applied that is selective to oxide so that only the nitride spacers 107, 117 are removed from the sidewalls of the NMOS and PMOS gates 119, 129. The removal of the implant spacers 107, 117 allows a hydrogen-rich source material to be formed adjacent to at least the PMOS gate electrodes 129 for to enable hydrogen-assisted interface trap passivation by introducing hydrogen which passivates surface dangling bonds of the PMOS channel semiconductor.

Figure 11:
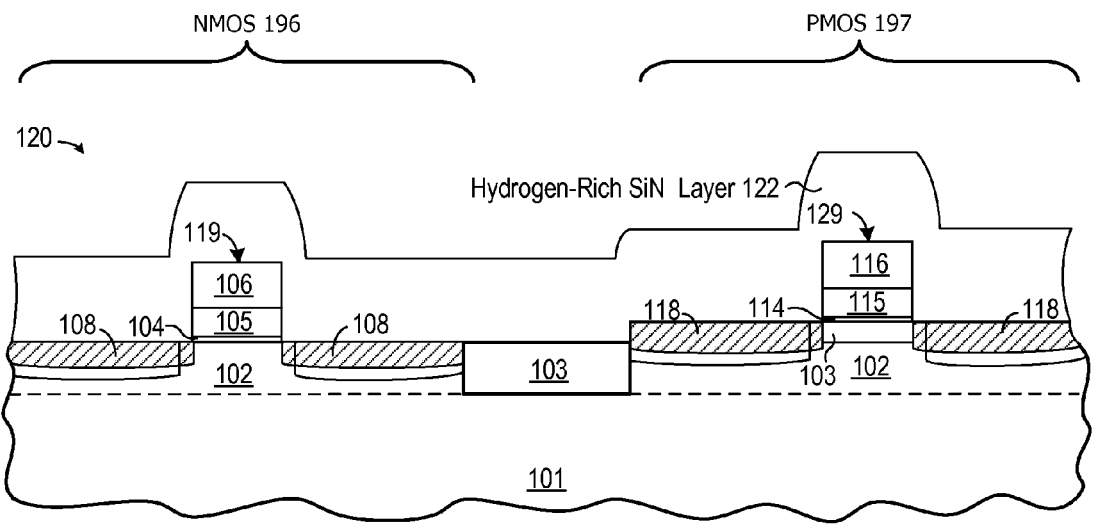
FIG. 11 illustrates processing subsequent to FIG. 10 after a hydrogen-containing silicon nitride layer is deposited over the metal gate electrodes.

Referring now to FIG. 11, there is illustrated the processing of the semiconductor wafer structure 120 subsequent to FIG. 10 after a hydrogen-rich dielectric layer 122 is deposited over the NMOS and PMOS transistors 119, 129 in accordance with one or more second example embodiments. In selected embodiments, the hydrogen-rich dielectric layer 122 is deposited as a silicon nitride layer using a PECVD technique to a thickness in the range of 300-1000 Angstroms, and more particularly approximately 600 Angstroms, though other materials and/or thicknesses may be used. In addition, the hydrogen-rich silicon nitride layer 122 is characterized in terms of having a hydrogen atomic content in the range of 7-15 percent, and more particularly on the order of at least 7 percent. As will be appreciated, the deposition conditions (e.g., deposition rate, pressure, UV curing, and other factors known in the art) may be selected to control the presence or type of stress created in the hydrogen-containing silicon nitride layer 62 and in between the layer 62 and the underlying NMOS and PMOS channel regions. At this point in the fabrication process when the source/drain regions 108, 118 have already been annealed, the placement of the hydrogen-rich silicon nitride layer 122 in close proximity to the NMOS gate electrode 119 does not adversely affect the NMOS device performance.

Figure 12:
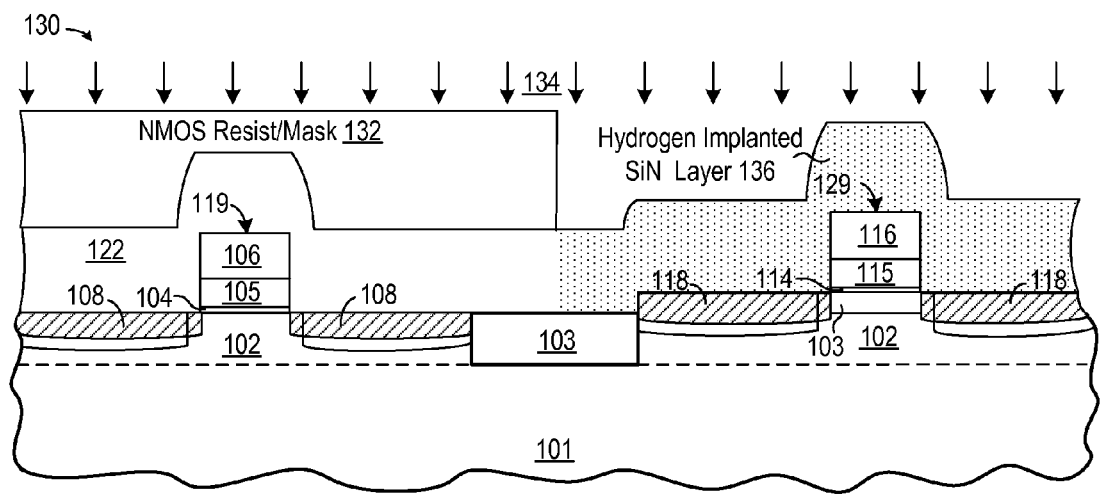
FIG. 12 illustrates processing subsequent to FIG. 11 after hydrogen is selectively implanted into the PMOS areas around a patterned implant mask.

FIG. 12 illustrates processing of the semiconductor wafer structure 130 subsequent to FIG. 11 after hydrogen 134 is selectively implanted into the hydrogen-rich dielectric layer 122 in the PMOS areas. A patterned implant mask 132 may be used to selectively implant the hydrogen 134 into the PMOS regions 197, such as by using a photoresist patterning process to form a photoresist-masking layer 132 over NMOS areas 196 of the semiconductor wafer structure 130 that will be used to form NMOS devices. For example, one or more photoresist or masking layers 132 (e.g., an oxide layer and/or nitride layer) may be deposited and/or grown over the semiconductor wafer structure, and then conventional patterning and etching techniques may be used to form an opening in the mask layer(s) 132 that exposes at least the PMOS device area 197.

After masking off the hydrogen-rich dielectric layer 122 in the NMOS region 196 with the patterned masking layer 132, the hydrogen-containing dielectric layer is processed to increase the hydrogen content in the PMOS region 197, such as by implanting hydrogen, thereby forming an implanted hydrogen-rich silicon nitride layer 136. In accordance with selected embodiments, the hydrogen implant 134 may be performed by implanting hydrogen atoms in an energy range of 2.5 KeV to 5.5 KeV at a dose of 1E15 to 1E16 per $cm^2$ or more, though other implant energies and/or doses may be used. By masking off the NMOS region 196 from the hydrogen implantation 134, the hydrogen-rich dielectric layer 122 is protected against additional hydrogen being formed in the NMOS region 196. After the hydrogen implantation step, the photoresist or mask layer 132 is stripped or removed.

As will be appreciated, additional or different processing steps may be used to complete the fabrication of the depicted gate electrode structures into functioning transistors including, but not limited to, one or more sacrificial oxide formation, stripping, extension implant, halo implant, spacer formation, source/drain implant, source/drain anneal, contact area silicidation, and polishing steps. In addition, conventional backend processing (not depicted) typically including multiple levels of interconnect is then required to connect the transistors in a desired manner to achieve the desired functionality. Thus, the specific sequence of steps used to complete the fabrication of the gate transistors may vary, depending on the process and/or design requirements.

By now, it should be appreciated that there has been provided herein a semiconductor fabrication process for forming a PMOS field effect transistor device. In the disclosed methodology, a wafer is provided that includes a first semiconductor layer, either alone as a bulk substrate or in combination with an underlying buried insulating layer as part of an SOI substrate. On at least part of the first semiconductor layer, a compressive silicon germanium layer may be formed, such as by epitaxially growing silicon germanium to a predetermined thickness. At least a PMOS gate structure, such as a high-k dielectric and a metal gate electrode, is formed over the first semiconductor layer and compressive silicon germanium layer to define a PMOS transistor channel region which includes at least a portion of the compressive silicon germanium layer below the PMOS gate structure. In addition, a hydrogen-rich dielectric layer is formed on exposed sidewalls of the PMOS gate structure or adjacent thereto, where the hydrogen-rich dielectric layer acts as a hydrogen source for a gate dielectric layer under the PMOS gate structure. For example, the hydrogen-rich dielectric layer may have a hydrogen atomic content in the range of 7-15 percent, and more particularly on the order of at least approximately 7-15 percent. In selected embodiments, the hydrogen-rich dielectric layer is formed by depositing a silicon nitride layer on exposed sidewalls of the PMOS gate structure (or adjacent thereto if a dielectric liner is present) prior to forming deep source/drain regions, implanting hydrogen into the silicon nitride layer to form a hydrogen-rich silicon nitride layer on or adjacent to the sidewalls of the PMOS gate structure, and then anisotropically etching the hydrogen-rich silicon nitride layer to form sidewall implant spacers adjacent to the PMOS gate structure that are used as an implant mask to implant deep source/drain regions into at least the compressive silicon germanium layer. In other selected embodiments, the hydrogen-rich dielectric layer is formed by first selectively etching implant spacers from sidewalls of the PMOS gate structure that were used to form source/drain regions below the PMOS gate structure, followed by depositing a hydrogen-rich silicon nitride layer on or adjacent to the sidewalls of the PMOS gate structure after forming the source/drain regions, and then implanting hydrogen into the hydrogen-rich silicon nitride layer on or adjacent to the exposed sidewalls of the PMOS gate structure.

In another form, there is provided a CMOS fabrication process for forming a semiconductor integrated circuit. As disclosed, a first semiconductor layer is formed that may have a <100> channel orientation, and that may have a compressive silicon germanium layer formed on at least the PMOS device area of the semiconductor layer. On the semiconductor layer, NMOS and PMOS gate structures are formed, which may include a high-k dielectric and a metal gate electrode, to define NMOS and PMOS transistor channel regions. A hydrogen-rich dielectric layer is formed on or adjacent to the sidewalls of at least the PMOS gate structures (or adjacent thereto if a dielectric liner is present) to act as a hydrogen source for passivating channel surface defectivity under the PMOS gate structure. For example, the hydrogen-rich dielectric layer may have a hydrogen atomic content in the range of 7-15 percent, and more particularly on the order of at least 7 percent. In selected embodiments, the hydrogen-rich dielectric layer is formed by depositing a hydrogen-containing silicon nitride layer by PECVD on or adjacent to the sidewalls of the PMOS and NMOS gate structures; forming a patterned implant mask to cover the NMOS gate structures and expose the silicon nitride layer on the PMOS gate structures; selectively implanting hydrogen into the silicon nitride layer on the PMOS gate structures to form a hydrogen-rich silicon nitride layer on or adjacent to the sidewalls of the PMOS gate structures; removing the patterned implant mask; and then anisotropically etching the hydrogen-rich silicon nitride layer to form hydrogen-rich sidewall implant spacers adjacent to the PMOS gate structure which are used during implantation of p-type deep source/drain regions in at least the first semiconductor layer using the hydrogen-rich sidewall implant spacers and PMOS gate structure as an implantation mask. In other embodiments, the hydrogen-rich dielectric layer is formed by depositing a hydrogen-rich silicon nitride layer on or adjacent to the sidewalls of the PMOS gate structure after forming silicided source/drain regions around the PMOS and NMOS gate structures and in the first semiconductor layer, where the hydrogen-rich silicon nitride layer on or adjacent to the sidewalls of the PMOS gate structures may be selectively implanted with hydrogen.

In yet another form, there is provided a semiconductor device and method for fabricating same, where the semiconductor device includes PMOS and NMOS gate structures overlying a semiconductor substrate which has a <100> channel orientation and which comprises a silicon germanium channel region layer formed in a PMOS device area. In the semiconductor device, first sidewall structures are formed adjacent to the NMOS gate structures, and second hydrogen-rich sidewall structures are formed adjacent to the PMOS gate structures which have a hydrogen atomic content that is at or above the predetermined threshold percentage so as to provide a hydrogen source for passivating channel surface defectivity under the PMOS gate structures.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process for forming a PMOS field effect transistor device, comprising:
   providing a wafer comprising a first semiconductor layer;
   forming at least a PMOS gate structure overlying the first semiconductor layer to define a PMOS transistor channel region; and
   forming a hydrogen-rich dielectric layer on or adjacent to sidewalls of the PMOS gate structure by depositing a dielectric layer on or adjacent to sidewalls of the PMOS gate structure and implanting hydrogen into the dielectric layer, where the hydrogen-rich dielectric layer acts as a hydrogen source for a gate dielectric layer under the PMOS gate structure.

2. The process of claim 1, further comprising forming a compressive silicon germanium layer on at least part of the first semiconductor layer so that the PMOS gate structure overlies the compressive silicon germanium layer to define a PMOS transistor channel region comprising at least a portion of the compressive silicon germanium layer below the PMOS gate structure.

3. The process of claim 2, where forming the compressive silicon germanium layer comprises epitaxially growing silicon germanium to a predetermined thickness.

4. The process of claim 1, where forming the hydrogen-rich dielectric layer comprises:
   depositing a silicon nitride layer on or adjacent to sidewalls of the PMOS gate structure prior to forming deep source/drain regions;
   implanting hydrogen into the silicon nitride layer to form a hydrogen-rich silicon nitride layer on or adjacent to the sidewalls of the PMOS gate structure; and anisotropically etching the hydrogen-rich silicon nitride layer to form sidewall implant spacers on or adjacent to the PMOS gate structure.

5. The process of claim 1, further comprising selectively etching implant spacers from sidewalls of the PMOS gate structure prior to forming the hydrogen-rich dielectric layer, where the implant spacers were used to form source/drain regions below the PMOS gate structure.

6. The process of claim 5, where forming the hydrogen-rich dielectric layer comprises depositing a hydrogen-rich silicon nitride layer on or adjacent to sidewalls of the PMOS gate structure after forming the source/drain regions.

7. The process of claim 6, where forming the hydrogen-rich dielectric layer further comprises implanting hydrogen into the hydrogen-rich silicon nitride layer on or adjacent to sidewalls of the PMOS gate structure.

8. The process of claim 1, where the PMOS gate structure comprises a high-k dielectric and a metal gate electrode.

9. The process of claim 1, where the hydrogen-rich dielectric layer on or adjacent to sidewalls of the PMOS gate structure has a hydrogen atomic content of at least approximately 7-15 percent.

10. A CMOS fabrication process for forming a semiconductor integrated circuit, comprising:
   providing a first semiconductor layer;
   forming PMOS and NMOS gate structures over the first semiconductor layer; and
   forming a hydrogen-rich dielectric layer to act as a hydrogen source for passivating channel surface defectivity under the PMOS gate structure by:
      forming a silicon nitride layer on or adjacent to sidewalls of the PMOS and NMOS gate structures;
      selectively implanting hydrogen into the silicon nitride layer to form a hydrogen-rich silicon nitride layer on or adjacent to sidewalls of the PMOS gate structure; and
      anisotropically etching the hydrogen-rich silicon nitride layer to form hydrogen-rich sidewall implant spacers adjacent to the PMOS gate structure.

11. The CMOS fabrication process of claim 10, further comprising forming a compressive silicon germanium layer in a PMOS device area and not an NMOS device area of the first semiconductor layer prior to forming the PMOS and NMOS gate structures.

12. The CMOS fabrication process of claim 10, where forming PMOS and NMOS gate structures comprises:
   forming a plurality of metal gate electrodes over a high-k containing dielectric layer that is formed on the first semiconductor layer.

13. The CMOS fabrication process of claim 10, where forming a silicon nitride layer comprises depositing a layer of hydrogen-containing silicon nitride using plasma-enhanced CVD.

14. The CMOS fabrication process of claim 10, where selectively implanting hydrogen comprises:
   forming a patterned implant mask to cover the NMOS gate structure and expose the silicon nitride layer on the PMOS gate structure; and
   implanting hydrogen into the silicon nitride layer on the PMOS gate structure to form the hydrogen-rich silicon nitride layer.

15. The CMOS fabrication process of claim 14, further comprising removing the patterned implant mask after implanting hydrogen into the silicon nitride layer and before anisotropically etching the hydrogen-rich silicon nitride layer.

16. The CMOS fabrication process of claim 10, where forming the hydrogen-rich dielectric layer comprises depositing a hydrogen-rich silicon nitride layer on or adjacent to sidewalls of the PMOS gate structure after forming silicided source/drain regions around the PMOS and NMOS gate structures and in the first semiconductor layer and selectively implanting hydrogen into the hydrogen-rich silicon nitride layer on or adjacent to sidewalls of the PMOS gate structure.

17. The CMOS fabrication process of claim 10, where the hydrogen-rich dielectric layer on or adjacent to sidewalls of the PMOS gate structure has a hydrogen atomic content on the order of at least 7 percent.

18. A semiconductor device comprising:
   a semiconductor substrate with a <100> channel orientation and comprising a silicon germanium channel region layer formed in a PMOS device area;
   PMOS and NMOS gate structures overlying the semiconductor substrate;
   first sidewall structures formed adjacent to the NMOS gate structure; and
   second hydrogen-rich sidewall structures formed adjacent to the PMOS gate structure which have a hydrogen atomic content that is at or above the predetermined threshold percentage so as to provide a hydrogen source for passivating channel surface defectivity under the PMOS gate structure.

* * * * *